US007800870B2

(12) United States Patent
Matsumoto et al.

(10) Patent No.: US 7,800,870 B2
(45) Date of Patent: Sep. 21, 2010

(54) POWER PROTECTION APPARATUS AND ELECTRONIC CONTROL UNIT

(75) Inventors: Toshihiro Matsumoto, Kobe (JP); Hiroshi Tsukuda, Kobe (JP)

(73) Assignee: Fujitsu Ten Limited, Kobe (JP)

( * ) Notice: Subject to any disclaimer, the term of this patent is extended or adjusted under 35 U.S.C. 154(b) by 244 days.

(21) Appl. No.: 12/213,677

(22) Filed: Jun. 23, 2008

(65) Prior Publication Data
US 2009/0002901 A1    Jan. 1, 2009

(30) Foreign Application Priority Data
Jun. 29, 2007    (JP) ............................. 2007-173301

(51) Int. Cl.
*H02H 9/08* (2006.01)
(52) U.S. Cl. ....................................... 361/18; 361/93.9
(58) Field of Classification Search .................. 361/18, 361/93.7–93.9; 323/207, 282, 284
See application file for complete search history.

(56) References Cited

U.S. PATENT DOCUMENTS

| 4,127,885 | A | 11/1978 | Adam et al. | |
|---|---|---|---|---|
| 6,998,818 | B2 * | 2/2006 | Xiong et al. | 320/134 |
| 2002/0026287 | A1 | 2/2002 | Mizuno et al. | |
| 2003/0020437 | A1 | 1/2003 | Kanamori | |

FOREIGN PATENT DOCUMENTS

| DE | 36 01 659 A1 | 7/1987 |
|---|---|---|
| EP | 1 182 761 A2 | 2/2002 |
| JP | U-61-180317 | 11/1986 |
| JP | A-05-328711 | 12/1993 |
| JP | A-10-146046 | 5/1998 |
| JP | A-2000-245142 | 9/2000 |
| JP | A-2001-119960 | 4/2001 |
| JP | A-2005-121433 | 5/2005 |

OTHER PUBLICATIONS

May 31, 2010 Office Action issued in Chinese Patent Application No. 200810127426.8 (with partial translation).

* cited by examiner

*Primary Examiner*—Danny Nguyen
(74) *Attorney, Agent, or Firm*—Oliff & Berridge, PLLC

(57) ABSTRACT

A power protection apparatus including: a switch unit connected in series in a power supply line from a power source to a DC regulator; a first short-circuit detector for detecting a short circuit based on an output voltage value of the DC regulator obtained by making the switch unit conductive for predetermined time and, after that, interrupting the switch unit; a second short-circuit detector for detecting a short circuit based on a value of current flowed in the switch unit when the switch unit is conductive; and a switch interrupting unit, when a short circuit is detected by the second short-circuit detector, for forcedly interrupting the switch unit regardless of a state of the switch unit controlled by the first short-circuit detector.

19 Claims, 11 Drawing Sheets

POWER PROTECTION APPARATUS AND ELECTRONIC CONTROL UNIT

This application is based on an application No. 2007-173301 filed in Japan, the contents of which are hereby incorporated by reference.

BACKGROUND OF THE INVENTION

1. Field of the invention

The present invention relates to a power protection apparatus and an electronic control unit including a switch unit serially connected to a power supply line extending from a power source to a DC regulator, a first short-circuit detector for detecting a short circuit based on an output voltage value of the DC regulator, obtained by making the switch unit conductive for predetermined time and, after that, interrupting the switch unit, and a resetting unit for resetting operation of the first short-circuit detector when the output voltage of the power source drops to a predetermined voltage.

2. Description of the related art

As shown in FIG. 1, in a DC regulator 100 constructed by a booster DC/DC converter, a MOS-FET 120 is controlled to be switched on or off by a booster DC/DC converter control IC 110, thereby adding energy accumulated in a coil 130 to energy of a power source 200 and outputting the resultant energy to a load circuit 300.

When something abnormal such as a short circuit occurs in the DC regulator 100 or the load circuit 300 in such a circuit configuration, unexpected high current flows from the power source 200 to the DC regulator 100 and the load circuit 300. There is consequently the possibility of a failure in an MOS-FET as a component of a switch circuit 400 for switching whether power is supplied from the power source 200 to the load circuit 300, a diode 140, the coil 130, and the like.

Consequently, as shown by a broken line in FIG. 1, by providing a switch circuit change-over unit 600 for turning on/off the switch circuit 400 and a microcomputer 500 for controlling the switch circuit change-over unit 600, the microcomputer 500 executes a primary check for determining whether an abnormality such as a short circuit occurs in the DC regulator 100 or the load circuit 300 or not at the start of power supply to the load circuit 300. When it is determined that an abnormality occurs, the switch circuit 400 is turned off via the switch circuit change-over unit 600, thereby preventing unexpected high current from being passed to a device which may fail.

The primary check will be described in detail below. As shown in FIG. 2, the microcomputer 500 turns on the switch circuit 400 for a predetermined period (30 msec in FIG. 2) via the switch circuit change-over unit 600, after that, turns off the switch circuit 400, and monitors a transient characteristic of output voltage of the DC regulator 100.

Predetermined charges are accumulated for the predetermined period in a capacitor 150 provided on the output side of the DC regulator 100. After that, the switch circuit 400 is turned off. Consequently, the charges accumulated in the capacitor 150 are discharged.

In the case where an abnormality such as a short circuit occurs, the charges accumulated in the capacitor 150 are discharged more sharply than discharge in a normal state. Therefore, whether an abnormality such as a short circuit occurs or not can be determined based on whether a drop in the output voltage is sharp or not.

The microcomputer 500 determines that when the output voltage of the DC regulator 100 is lower than a preset threshold voltage at a predetermined timing after turn-off of the switch circuit 400, an abnormality such as a short circuit occurs.

In the primary check, however, when resistance in a portion where a short circuit occurs in the DC regulator 100 and the load circuit 300 is zero or has a small resistance value such as 100 mΩ, at the moment of turn-on of the switch circuit 400, over current flows in the DC regulator 100 and the load circuit 300. Consequently, the output voltage of the power source 200 decreases and the following problem occurs.

Usually, to prevent an erroneous operation or the like of the microcomputer 500, a resetting unit 700 for forcedly resetting the microcomputer 500 when the output voltage of the power source 200 becomes equal to or lower than the preset predetermined value is provided.

As described above, when the output voltage of the power source 200 drops to a predetermined value or less, the resetting unit 700 operates to reset the microcomputer 500. Consequently, the switch circuit 400 which has been on via the switch circuit change-over unit 600 for the primary check is turned off.

As a result, the output voltage of the power source 200 is restored. The primary check is executed again by the microcomputer 500 operating after the reset, and the switch circuit 400 is turned on. As long as the short-circuit state continues, the resetting unit 700 starts again by short-circuit current.

That is, there is a problem such that, the switch circuit 400 repeats turn on/off and, by over current flowing during the turn on/off, the devices such as the switch circuit 400, the diode 140, and the coil 130 may be destroyed.

To solve such a problem, as shown in FIG. 3, a configuration may be employed in which a resistor R100 for detecting whether over current flows to the load side or not is connected in series in the output line of the power source 200 and a voltage across the resistor R100 is detected by the microcomputer 500.

When the microcomputer 500 determines that over current flows to the load side based on the voltage across the resistor R100, the switch circuit 400 is forcedly turned off regardless of the result of the primary check.

However, to detect over current caused by a short circuit properly and early based on the voltage across the resistor R100, it is necessary to perform sampling at high speed. There is a problem such that the expensive, high-performance microcomputer 500 is necessary.

As another example of a circuit for detecting an abnormality of this kind, Japanese Unexamined Patent Application Publication No. 2005-121433 discloses a disconnection detecting circuit for detecting an abnormality such as a disconnection of a load circuit operating under PWM control.

In the disconnection detecting circuit, current flowing in a load circuit is detected by a current detecting circuit, and a result of comparison between a voltage corresponding to the detected current and a reference voltage is input to a D-type flip flop. A PWM signal is input to a clock input terminal of the D-type flip flop, and presence or absence of disconnection is determined based on the comparison result input to the D-type flip flop around the falling timing of the PWM signal.

SUMMARY OF THE INVENTION

In view of the drawbacks of the conventional techniques, an object of the present invention is to provide a power protection apparatus or the like capable of reliably detecting a short circuit at low cost without causing breakage in a DC regulator and a load circuit.

To achieve the object, a power protection apparatus according to the present invention includes: a switch unit connected in series in a power supply line from a power source to a DC regulator; a first short-circuit detector for detecting a short circuit based on an output voltage value of the DC regulator obtained by making the switch unit conductive for predetermined time and, after that, interrupting the switch unit; and a resetting unit, when the output voltage of the power source drops to a predetermined voltage, for resetting operation of the first short-circuit detector, and further includes: a second short-circuit detector for detecting a short circuit based on a value of current flowed in the switch unit when the switch unit is conductive; and a switch interrupting unit, when a short circuit is detected by the second short-circuit detector, for forcedly interrupting the switch unit regardless of a c a state of the switch unit controlled by the first short-circuit detector.

The other aspects of the invention will become clear by referring to the following embodiments.

DESCRIPTION OF THE PREFERRED EMBODIMENTS

A power protection apparatus and an electronic control unit according to the present invention will be described below. In an embodiment, the case where a power protection apparatus is assembled in an electronic control unit including a CPU having a function of a display controller for controlling a liquid crystal module as a load mounted on a vehicle and connected to a DC regulator, and a memory for storing control information of the CPU will be described.

Figure 1:
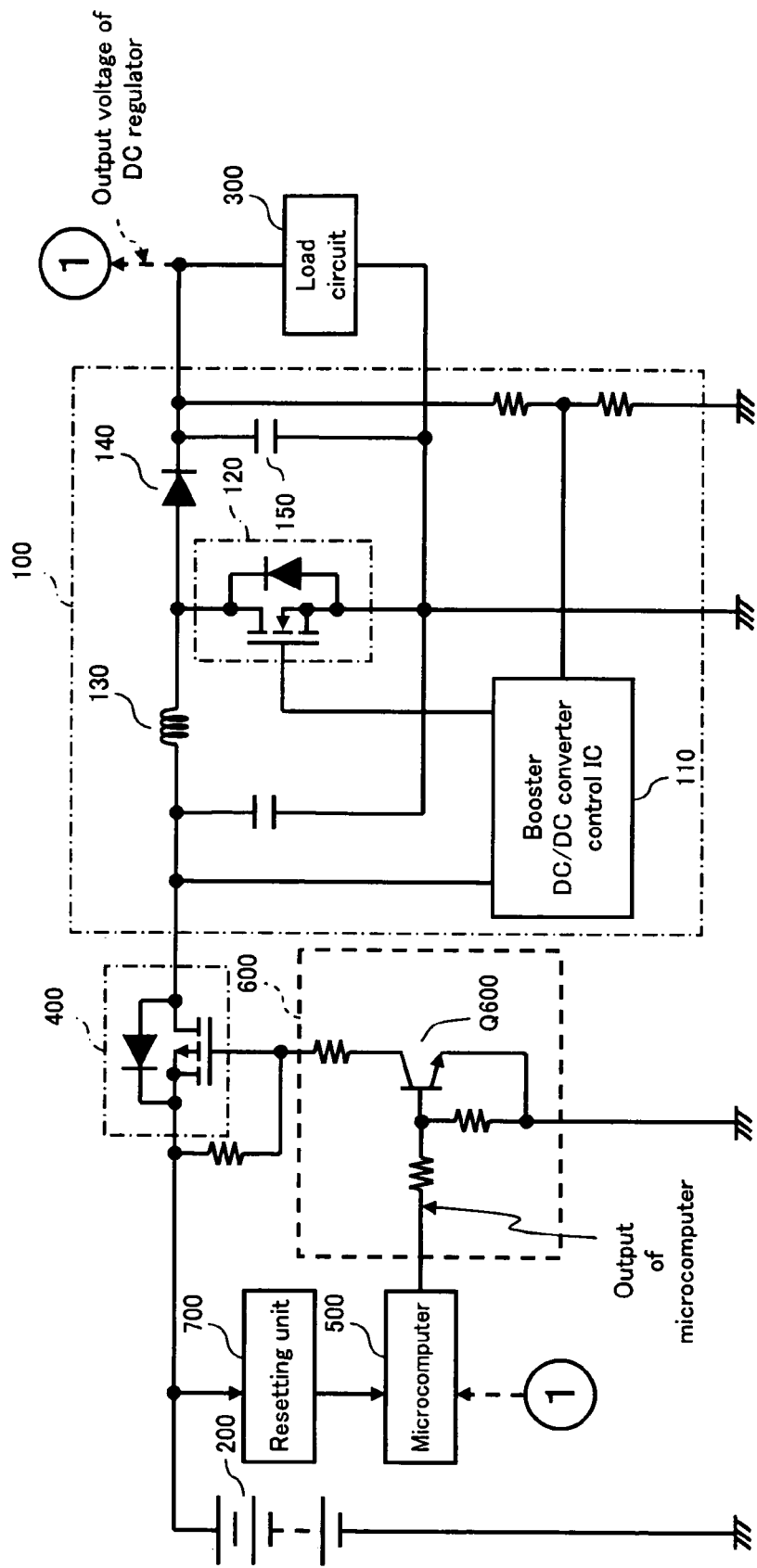
FIG. 1 shows a circuit diagram of a conventional power protection circuit and a DC regulator.
Figure 2:
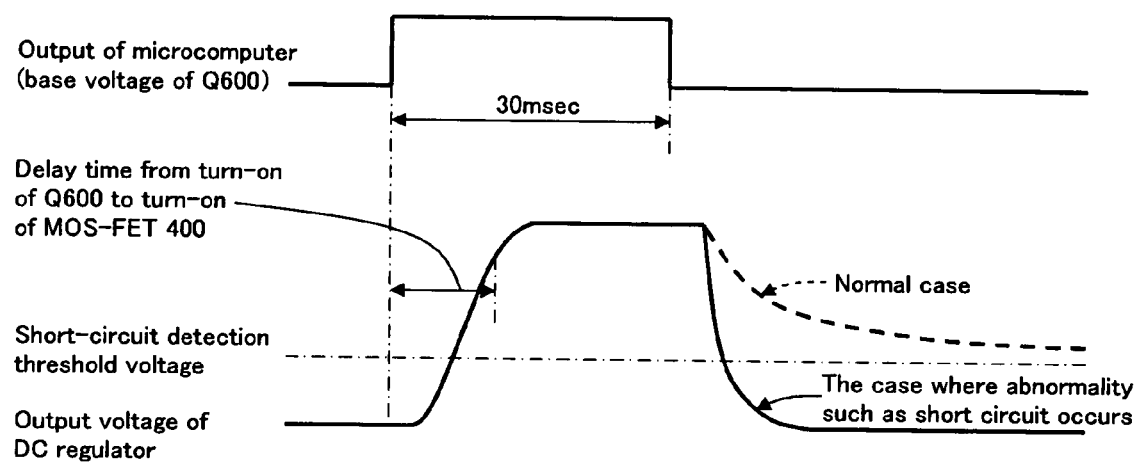
FIG. 2 shows a timing chart of a primary check performed by the conventional power protection circuit.
Figure 3:
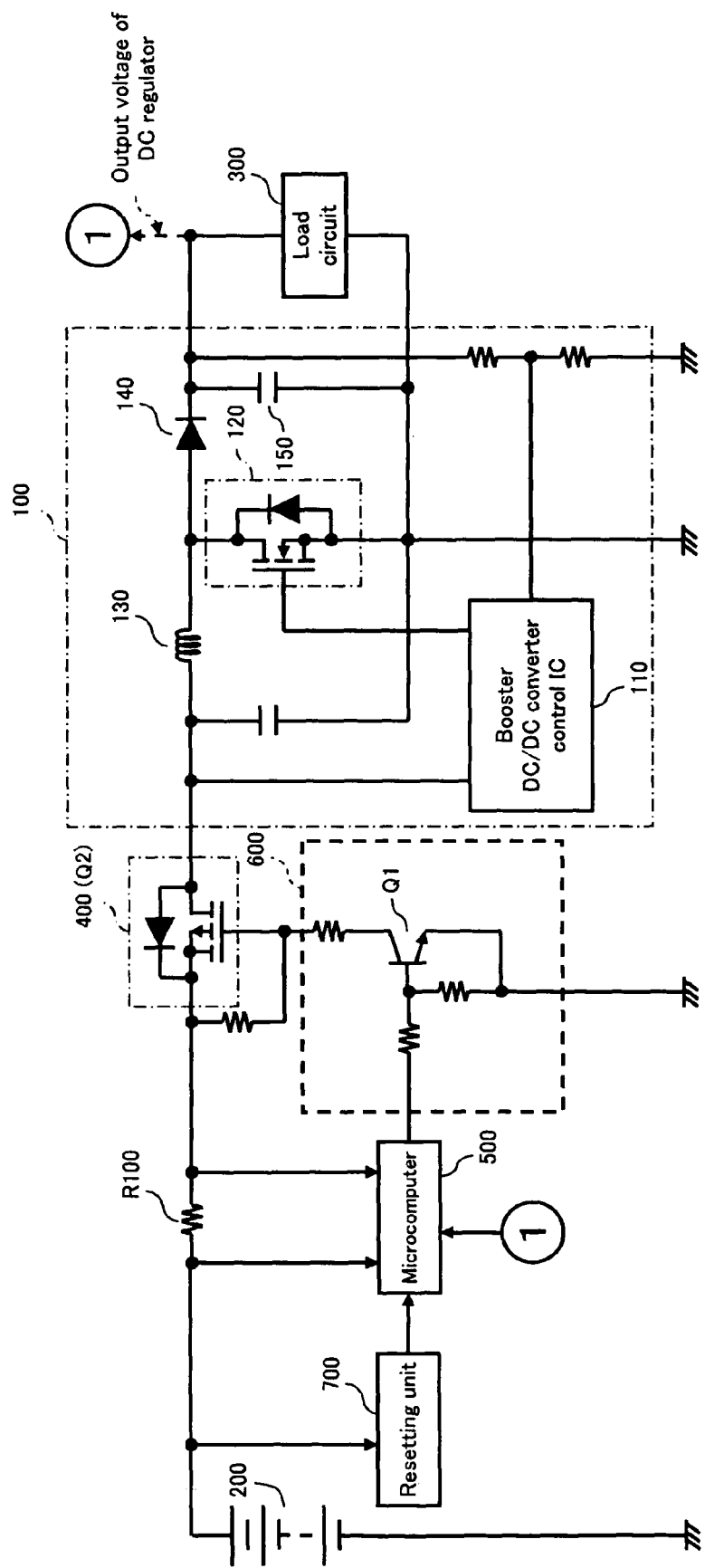
FIG. 3 shows a circuit diagram of a power protection circuit and a DC regulator in the case of detecting over current by software.
Figure 4:
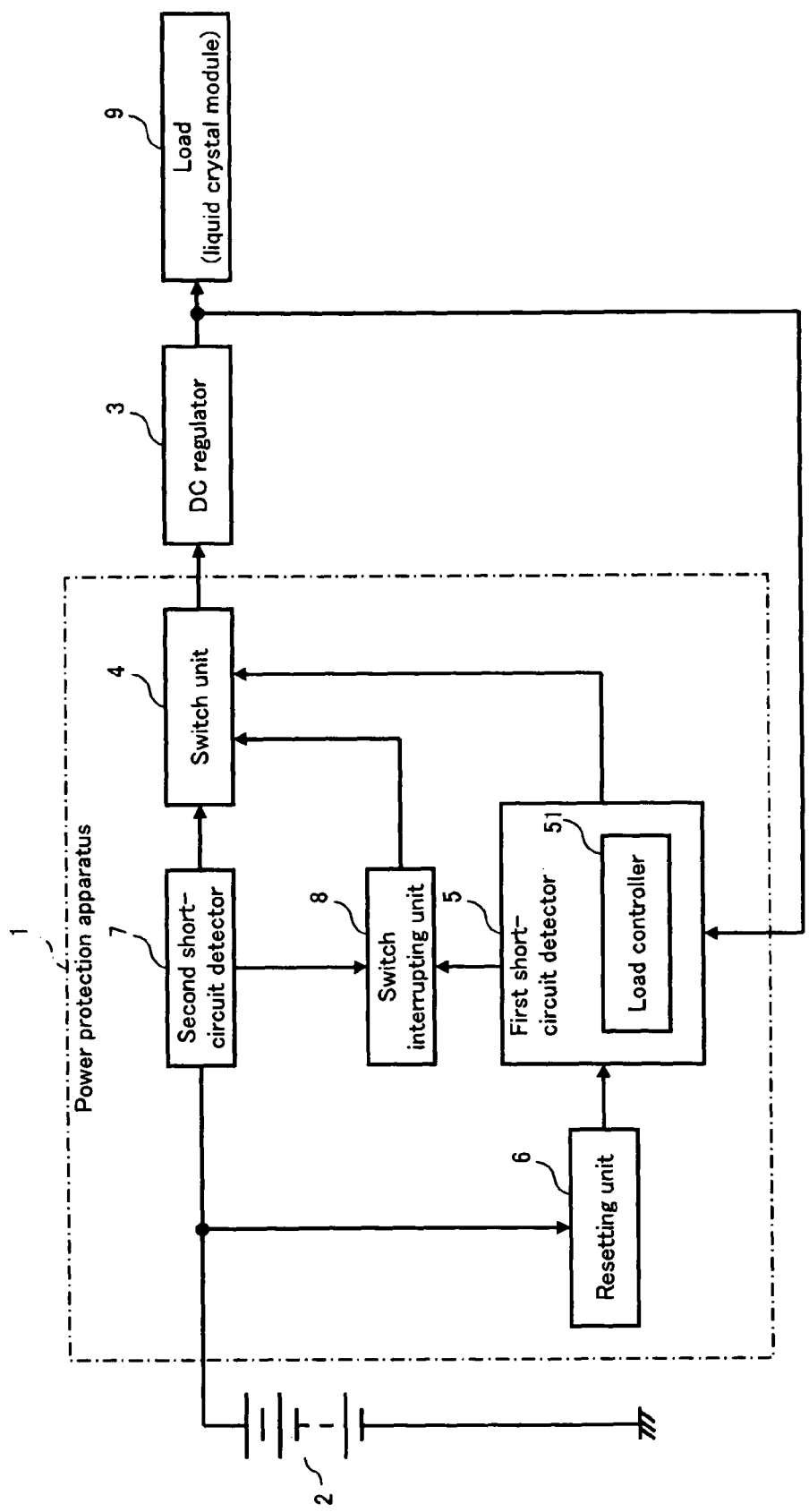
FIG. 4 shows a block configuration diagram of a power protection circuit according to the present invention.

As shown in FIG. 4, a power protection apparatus 1 has: a switch unit 4 including a MOS-FET 41 connected in series in a power supply line extending from a power source 2 of DC 14V constructed by an in-vehicle battery to a DC regulator 3; a first short-circuit detector 5 having a CPU for making the switch unit 4 conductive for predetermined time, interrupting the switch unit 4 and, after that, detecting a short circuit based on an output voltage value of the DC regulator 3; a resetting unit 6 for resetting the operation of the CPU when an output voltage of the power source 2 drops to a predetermined voltage; a second short-circuit detector 7 for detecting a short circuit based on a value of current flowing in the switch unit 4 when the switch unit 4 is conductive; and a switch interrupting unit 8, when a short circuit is detected by the second short-circuit detector 7, for forcedly interrupting the switch unit 4 regardless of a state of the switch unit 4 controlled by the first short-circuit detector 5.

Figure 5:
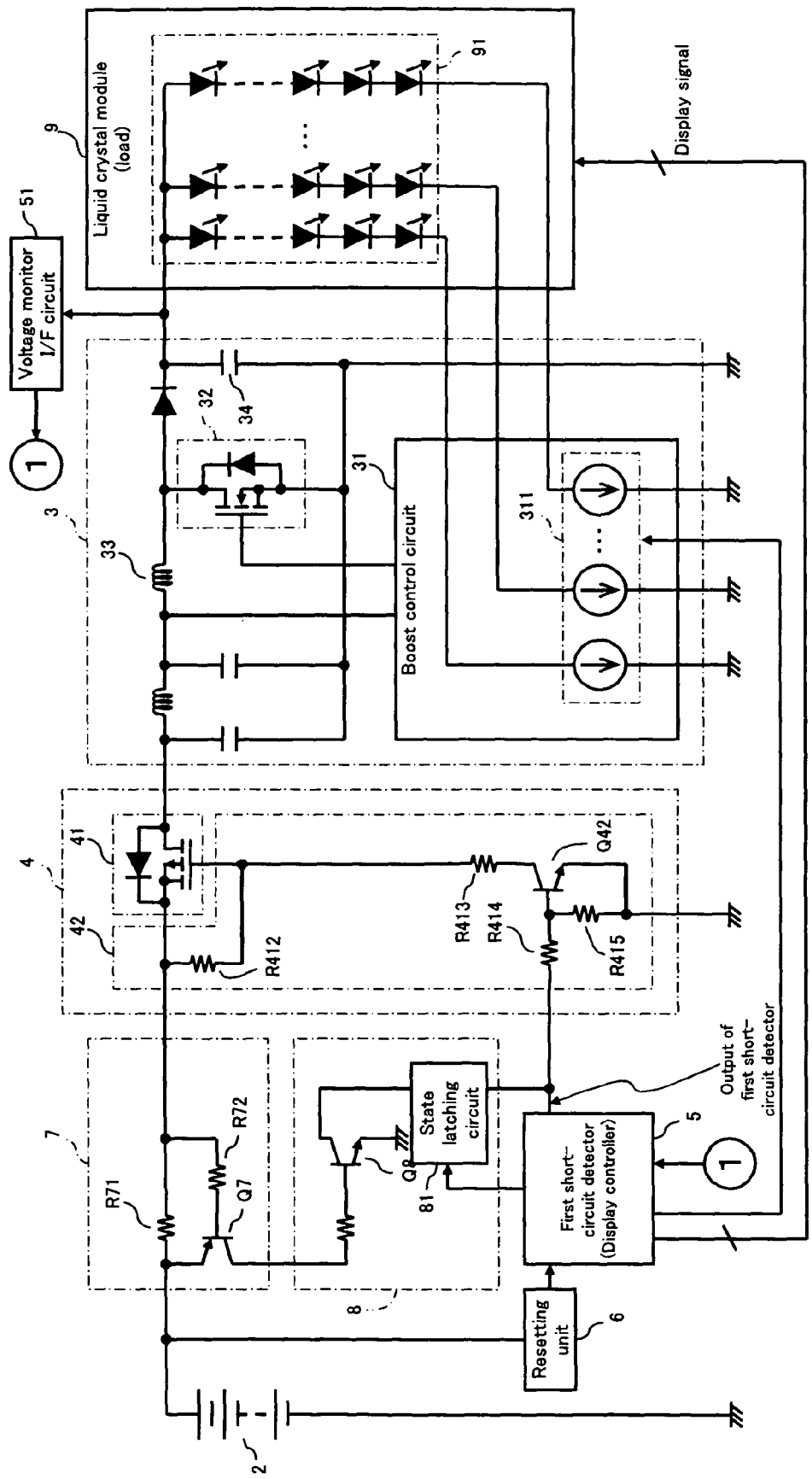
FIG. 5 shows a circuit diagram of the power protection circuit and a DC regulator according to the present invention.

As shown in FIG. 5, the DC regulator 3 is constructed by a boost switching regulator having a switching MOS-FET 32, a booster coil 33, and a smoothing capacitor 34, and a boost control circuit 31 for performing switching-control on the MOS-FET 32 in the boost switching regulator.

The boost control circuit performs the switching control on the MOS-FET 32 at a predetermined frequency, so that an electromotive force accumulated in the coil 33 when the MOS-FET 32 is on is added to the voltage of the power source 2. The resultant voltage is accumulated in the capacitor to boost the voltage to a DC voltage at a predetermined level.

In the boost control circuit 31, a plurality of constant current drivers 311 are assembled. The constant current drivers 311 are driven by the electronic control unit in which the first short-circuit detector 5 is assembled and supply current to a plurality of LEDs 91 constructing a backlight of a liquid crystal module.

Although the case where a load 9 to which power is supplied from the DC regulator 3 takes the form of the plurality of LEDs 91 serving as the backlight of the liquid crystal module will be described in the embodiment, for example, another arbitrary load 9 such as an ignition circuit of an air bag may be used.

The switch unit 4 includes the MOS-FET 41 for supplying/interrupting power from the power source 2 to the DC regulator 3, and a MOS-FET switch unit 42 for switching between conduction and interruption of the MOS-FET 41.

The MOS-FET switch unit 42 includes a resistor R412 connected between the source and the gate of the MOS-FET 41 and a transistor Q42 and a plurality of resistors R413 to R415 for switching between conduction and interruption of the MOS-FET 41 by controlling the voltage across the source and the gate of the MOS-FET 41.

By a high-level output signal from the first short-circuit detector 5 or the switch interrupting unit 8, the MOS-FET 41 is made conductive via the transistor Q42. By a low-level output signal, the MOS-FET 41 is interrupted via the transistor Q42.

As described above, the first short-circuit detector 5 is assembled in the electronic control unit having the CPU functioning as a display controller for displaying a video image in a display in the liquid crystal module and a memory. For example, when an accessory power switch (ACC-SW) is turned on, the power supply state from the power source 2 to the DC regulator 3 via the MOS-FET 41 is switch-controlled by controlling a base voltage of the transistor Q42, and a primary check for detecting a short-circuit state on the load side is made.

Figure 6A:
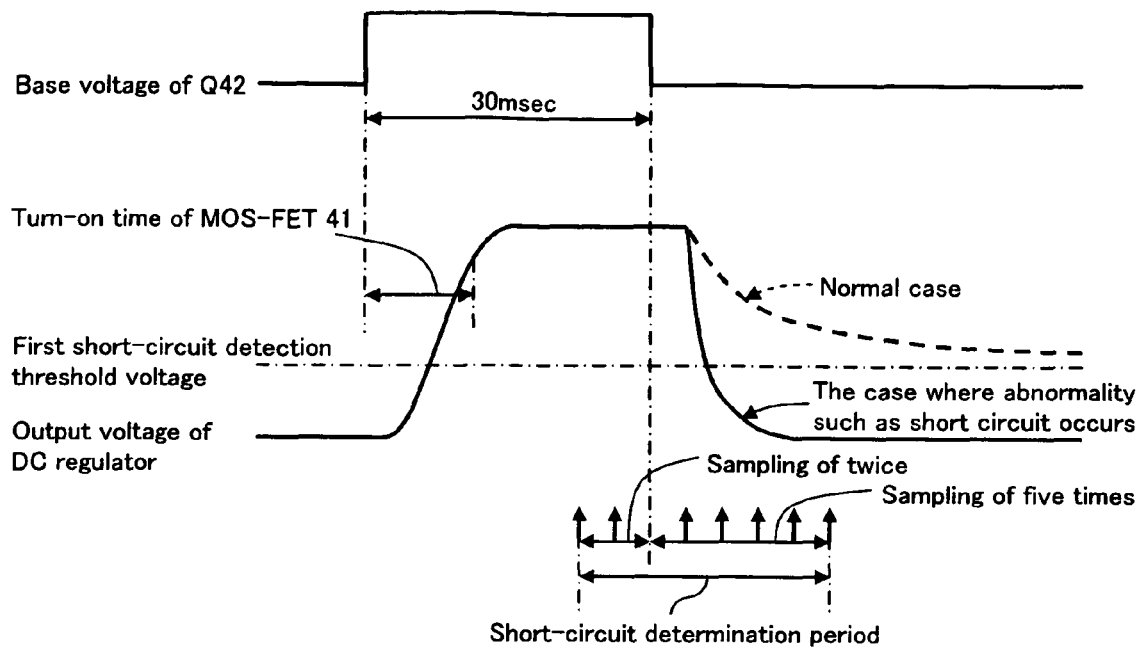
FIG. 6A shows a timing chart of a primary check performed by a first short-circuit detector.

Specifically, as shown in FIG. 6A, the first short-circuit detector 5 turns on the transistor Q42 for a predetermined period (which is set as 30 msec as time necessary to turn on the MOS-FET 41) and, after that, turns off the transistor Q42. The first short-circuit detector 5 monitors an output voltage of the DC regulator 3 during the period and a following predetermined short-circuit determination period via a voltage monitor interface circuit 51 to detect a short-circuit state on the load side.

In the case where the monitored output voltage is equal to or less than the preset first short-circuit detection threshold voltage during the short-circuit determination period, it is determined that a short circuit occurs. After that, by interrupting the MOS-FET 41 via the transistor Q42, power supply to the DC regulator 3 is stopped.

In the case where the monitored output voltage is higher than the preset first short-circuit detection threshold voltage within the short-circuit determination period, the state is determined as the normal state. After that, the MOS-FET 41 is made conductive via the transistor Q42 to supply power to the DC regulator 3.

In the embodiment, as shown in FIG. 6A, the period in which sampling of every 5 msec is performed twice before switching from the high level to the low level of an output signal to the transistor Q42 of the first short-circuit detector 5 and five times after the switching, that is, total seven times is set as the short-circuit determination period.

Figure 6B:
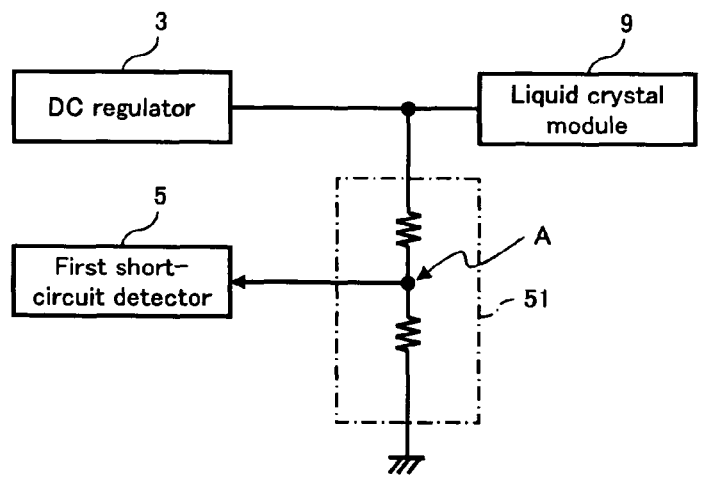
FIG. 6B is an explanatory diagram showing a voltage monitor interface circuit.

The voltage monitor interface circuit 51 may be constructed by an AD converter for directly AD-converting an output voltage of the DC regulator 3 or, for example, as shown in FIG. 6B, an AD converter for AD-converting a value of a voltage divided by two resistors connected in series.

When the first short-circuit detector 5 detects a short-circuit state early, it repeats the detection a plurality of times. As a result, when the short-circuit state is detected repeatedly, the first short-circuit detector 5 determines the short-circuit state, and stores the abnormality information into a storage taking the form of a nonvolatile memory or the like.

The abnormality information stored in the storage is transferred via a CAN (Controller Area Network) bus or the like to another electronic control unit, for example, that manages the abnormality information in a centralized manner.

To maintain the operation state of the CPU properly, the resetting unit 6 has a level detecting circuit for detecting whether the output voltage of the power source 2 has dropped to a predetermined power supply voltage drop detection level or less, and a CR time constant circuit for outputting a reset signal to the CPU for predetermined time when the output voltage drops to the predetermined power supply voltage drop detection level or less.

In place of a hardware resetting process of the CPU by the CR time constant circuit, a resetting process may be performed by software as follows. When the output voltage drops to the power supply voltage drop detection level or less, a signal from the level detecting circuit is output to an interrupt signal terminal of the CPU. The CPU starts the program again from the address 0 by an interrupting process.

When the load side is completely short-circuited, the output voltage of the power source 2 is decreased by the over current that flows in the primary check, the first short-circuit detector 5 is reset by the resetting unit 6, and the primary check is executed again while the operation is repeated, there is the possibility that devices such as the MOS-FET 41 and a choke coil 33 are destroyed by the over current which flows repeatedly from the power source 2.

Consequently, the second short-circuit detector 7 for detecting a short circuit before the short-circuit detection by the first short-circuit detector 5 and the switch interrupting unit 8 are provided.

The second short-circuit detector 7 has a resistor R71 connected in series between the power source 2 and the MOS-FET 41 and a voltage detecting circuit for detecting current flowing in the resistor R71 by the voltage across the resistor R71.

As shown in FIG. 5, the voltage detecting circuit may be constructed by a circuit having a transistor Q7 which is conducted when the voltage across the resistor R71 becomes a predetermined value or higher.

The second short-circuit detector 7 is constructed in such a manner that when current having a threshold at which a short circuit is detected or higher flows in the resistor R71, the transistor Q7 is turned on by a voltage drop in the resistor R71 corresponding to the current. An output signal of the transistor Q7 is output to the switch interrupting unit 8.

The second short-circuit detection threshold voltage corresponding to the threshold current for detecting a short circuit is determined by the resistance value of the resistor R71 and is set to a value higher than the first short-circuit detection threshold voltage of the first short-circuit detector 5.

Consequently, the second short-circuit detector 7 can avoid to erroneously detect, as a short-circuit state, the state in which the MOS-FET 41 is turned on and a current larger than that in a stationary state necessary to start-up the DC regulator 3 flows.

Therefore, the second short-circuit detector 7 can detect a so-called dead short-circuit state in which the load side is completely short-circuited, but cannot detect a so-called rare short-circuit state in which although short-circuit occurs, contact resistance in a short-circuit part is high. The first short-circuit detection threshold voltage is set so that the rare short-circuit state can be detected with reliability.

The switch interrupting unit 8 has: a transistor Q8 to which a base voltage is applied when the transistor Q7 of the second short-circuit detector 7 is made conductive, thereby turning off the transistor Q42; and a state latching circuit 81 for latching an output level of the transistor Q8. After the timing of the turn-on of the transistor Q8, the switch unit 4 is maintained in the interruption state by the state latching circuit 81.

The state latching circuit 81 can take the form of, for example, a D-type flip flop or a transistor logic circuit.

The state latching circuit 81 is reset when a reset signal is entered from the first short-circuit detector 5 after the short-circuit as the cause of interruption of the switch unit 4 by the switch interrupting unit 8 is eliminated, that is, in a state where the transistor Q7 is turned off.

The state latching circuit 81 is provided to prevent repetition of the operation such that when the switch unit 4 is interrupted by the switch interrupting unit 8, a short circuit is not detected by the second short-circuit detector 7, the transistor Q7 is turned off, and the MOS-FET 41 is made conductive.

Since the second short-circuit detector 7 is constructed by a hardware circuit, without using an expensive high-speed CPU, the apparatus can be formed at low cost, and overcurrent can be detected promptly. Inconvenience in the primary check caused by the first short-circuit detector 5 is eliminated.

Figure 8:
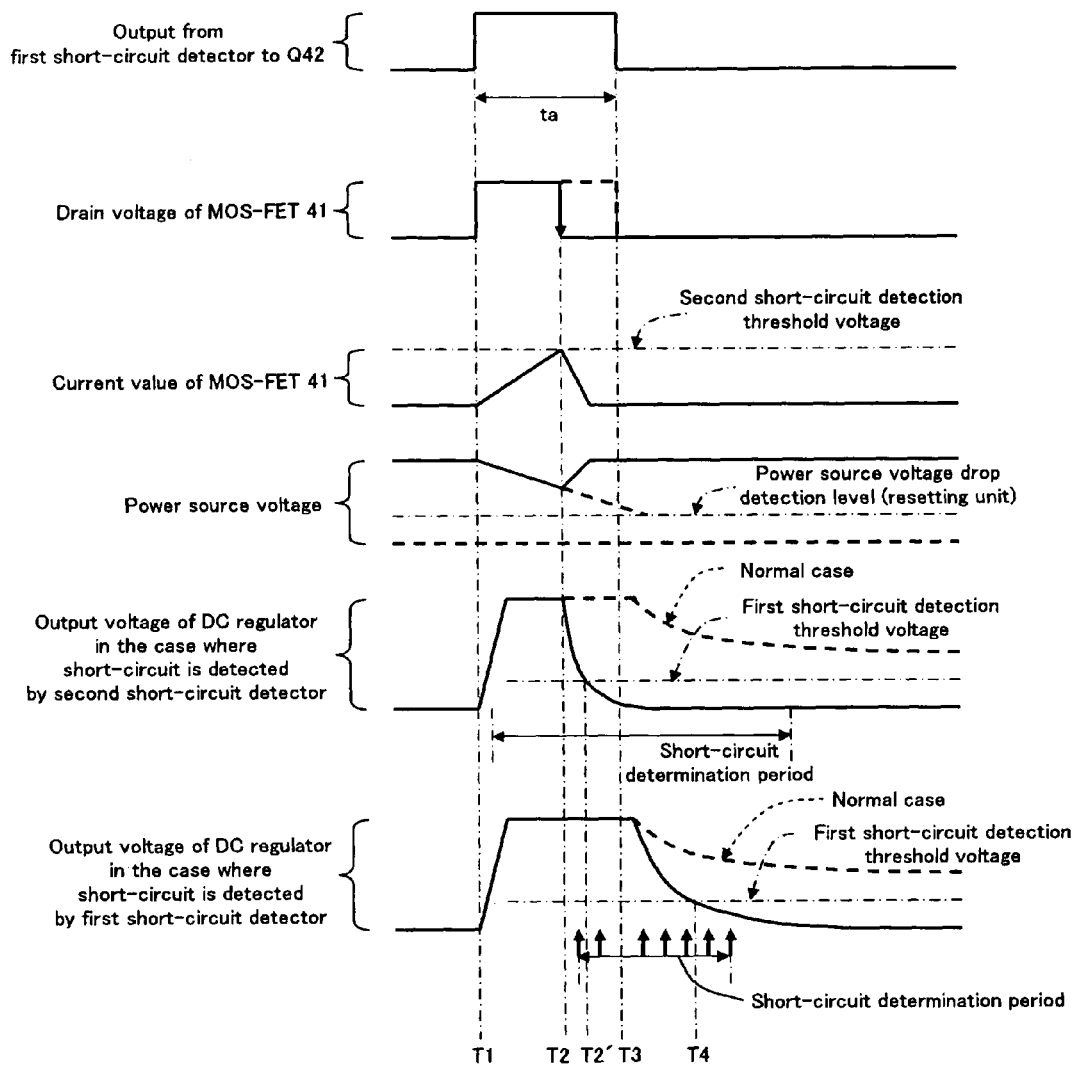
FIG. 8 is a time chart for explaining operations of the power protection apparatus on startup of the DC regulator.

The operation of the power protection apparatus 1 on startup of the DC regulator 3 will be described below based on the time chart of FIG. 8.

When the first short-circuit detector 5 turns on the transistor Q42 at time T1 and turns off the transistor Q42 at time T3 after lapse of a predetermined period ta (for example, 30 msec), accordingly, the MOS-FET 41 is turned on in its inherent turn-on time and turned off in its inherent turn-off time. When the MOS-FET 41 is turned on, the DC regulator 3 to which power is supplied from the power source 2 is boosted and driven.

When the second short-circuit detector 7 detects the voltage across the resistor R71 becomes equal to or higher than the second short-circuit detection threshold voltage at time T2, the transistor Q8 in the switch interrupting unit 8 is turned on and the MOS-FET 41 is forcedly turned off via the transistor Q42. That is, the dead short-circuit state is detected by the second short-circuit detector 7.

Since the output voltage of the DC regulator 3 whose load side is in the dead short-circuit state drops sharply due to the forced interruption of the MOS-FET 41, the first short-circuit detector 5 also detects a short circuit at time T2' at which the voltage becomes equal to or lower than the first short-circuit detection threshold voltage.

Since the MOS-FET 41 has been already interrupted by the second short-circuit detector 7, detection of a drop in the power supply voltage by the resetting unit 6 is not performed.

That is, the MOS-FET 41 is interrupted before the output voltage of the power source 2 becomes lower than the voltage drop detection threshold voltage by the resetting unit 6.

When a short circuit on the load side is not detected by the second short-circuit detector 7, before and after the time point when the first short-circuit detector 5 turns off the MOS-FET 41 at time T3, the output voltage of the DC regulator 3 is monitored via the voltage monitor interface circuit 51 at predetermined time intervals (or example, at intervals of 5 msec). When it is detected that the output voltage decreases below the first short-circuit detection threshold voltage during the period (T4), it is determined that the load side is in the rare short-circuit state (pseudo short-circuit state), similar short-circuit detecting operation is repeated a set number of times (for example, three times).

The short-circuit state may be determined when the output voltage value of the DC regulator 3 detected at the predetermined time intervals becomes below the first short-circuit detection threshold even once. The short-circuit state may be determined when the output voltage value is below the first short-circuit detection threshold a plurality of times in a row. Further, the short-circuit state may be determined by predicting that the output voltage value becomes below the first short-circuit detection threshold based on the gradient (differential value) of each of the output voltage values of the DC regulator 3 detected at predetermined time intervals.

The short-circuit detecting operation is repeated the set number of times. As a result, when a short circuit state is determined in all of the set number of times of the operation, the abnormality information is stored in the storage, and the interruption state of the MOS-FET 41 is maintained.

On the other hand, when no short circuit is detected by the first and second short-circuit detectors 5 and 7, it is determined that the state is normal. The first short-circuit detector 5 makes the MOS-FET 41 conductive to maintain the power supply to the DC regulator 3.

The first and second short-circuit threshold voltages will be described in detail below. The first short-circuit detection threshold voltage of the first short-circuit detector 5 is set for, for example, voltage at point A shown in FIG. 6B for monitoring the output voltage of the DC regulator 3.

On the other hand, the second short-circuit detection threshold voltage of the second short-circuit detector 7 is set for a drop in the voltage across the resistor R71 caused by the current flowing in the resistor R71.

Since the objects of setting the threshold voltages are different from each other as described above, the first and second short-circuit detection threshold voltages have to be set under a predetermined correlation.

Figure 7B:
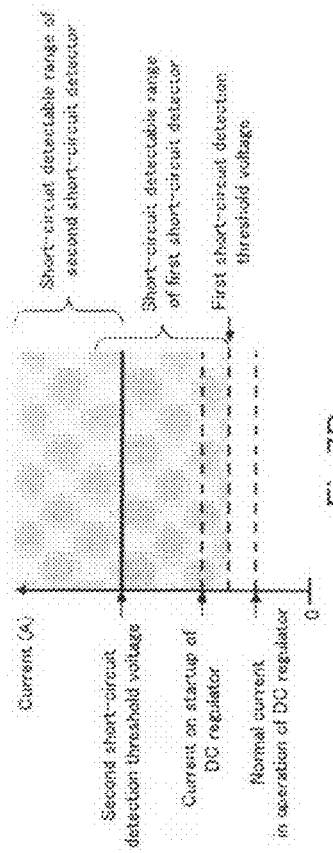
FIG. 7B is an explanatory diagram showing a short-circuit detectable range of the first short-circuit detector.
Figure 7D:
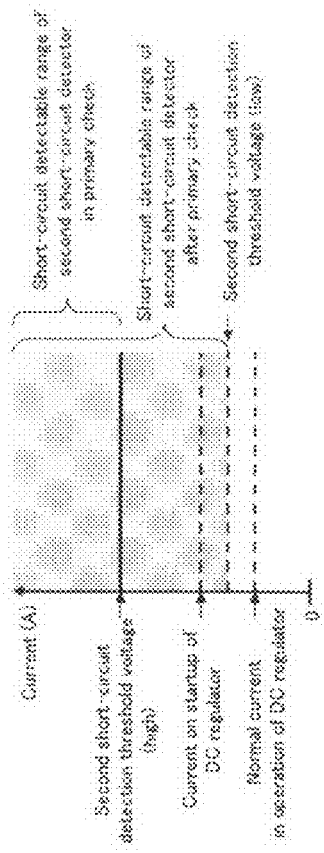
FIG. 7D is an explanatory diagram showing a short-circuit detectable range of the first and second short-circuit detectors in the case where a constant current driver is stopped.
Figure 7A:
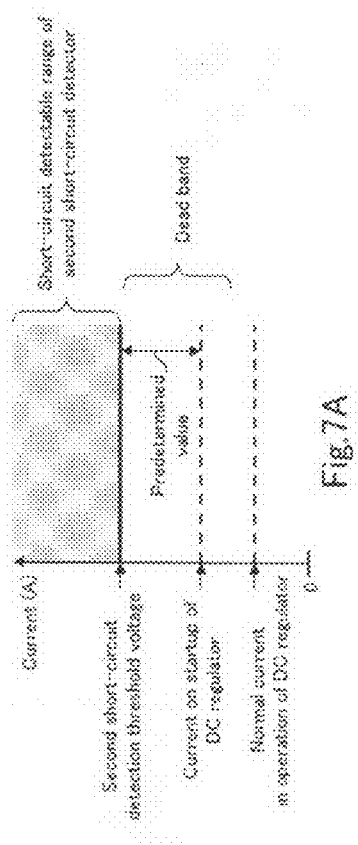
FIG. 7A is an explanatory diagram showing a short-circuit detectable range of a second short-circuit detector.

Description will be given using the current flowing in the MOS-FET 41 as a reference as shown in FIG. 7A. The second short-circuit detection threshold voltage for detecting a so-called dead short circuit (complete short-circuit) is set to a large value which is larger than the maximum current value on startup of the DC regulator 3 only by a predetermined value in consideration of the characteristic variations in the circuit elements.

In this case, in the second short-circuit detector 7, a dead band is generated where the so-called rare short-circuit state in which current smaller than the current corresponding to the second short-circuit detection threshold voltage flows cannot be detected.

Consequently, as shown in FIG. 7B, the first short-circuit detection threshold voltage is set to a level at which current slightly larger than the current in the normal operation after the DC regulator 3 starts up can be detected so as to cover the dead band. As a result, abnormalities from the rare short-circuit to the dead short-circuit can be detected.

Preferably, the electronic control unit as a display controller is provided with a load controller to turn off the plurality of constant current drivers 311 to stop power supply to an LED array 9 as a load connected to the DC regulator 3 at the time of a primary check made by the first short-circuit detector 5.

Figure 7C:
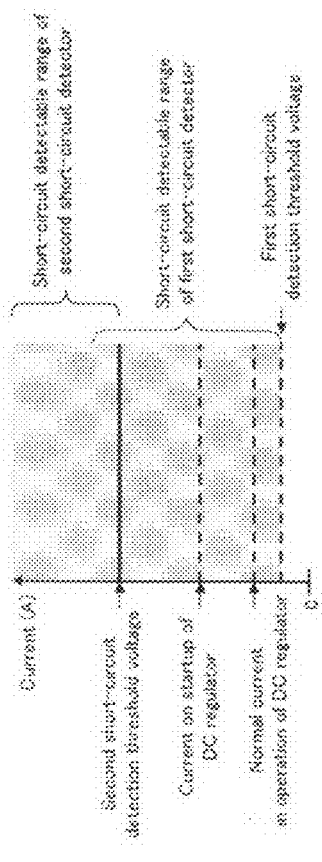
FIG. 7C is an explanatory diagram showing a short-circuit detectable range of the first and second short-circuit detectors.

In this case, power is not supplied from the DC regulator 3 to the load. Therefore, by setting the first short-circuit detection threshold voltage to a level at which current slightly lower than the current in the normal operation after startup of the DC regulator 3 can be detected, the short-circuit detectable range can be extended downward as shown in FIG. 7C. A delicate rare short-circuit state can be also detected reliably.

Figure 9:
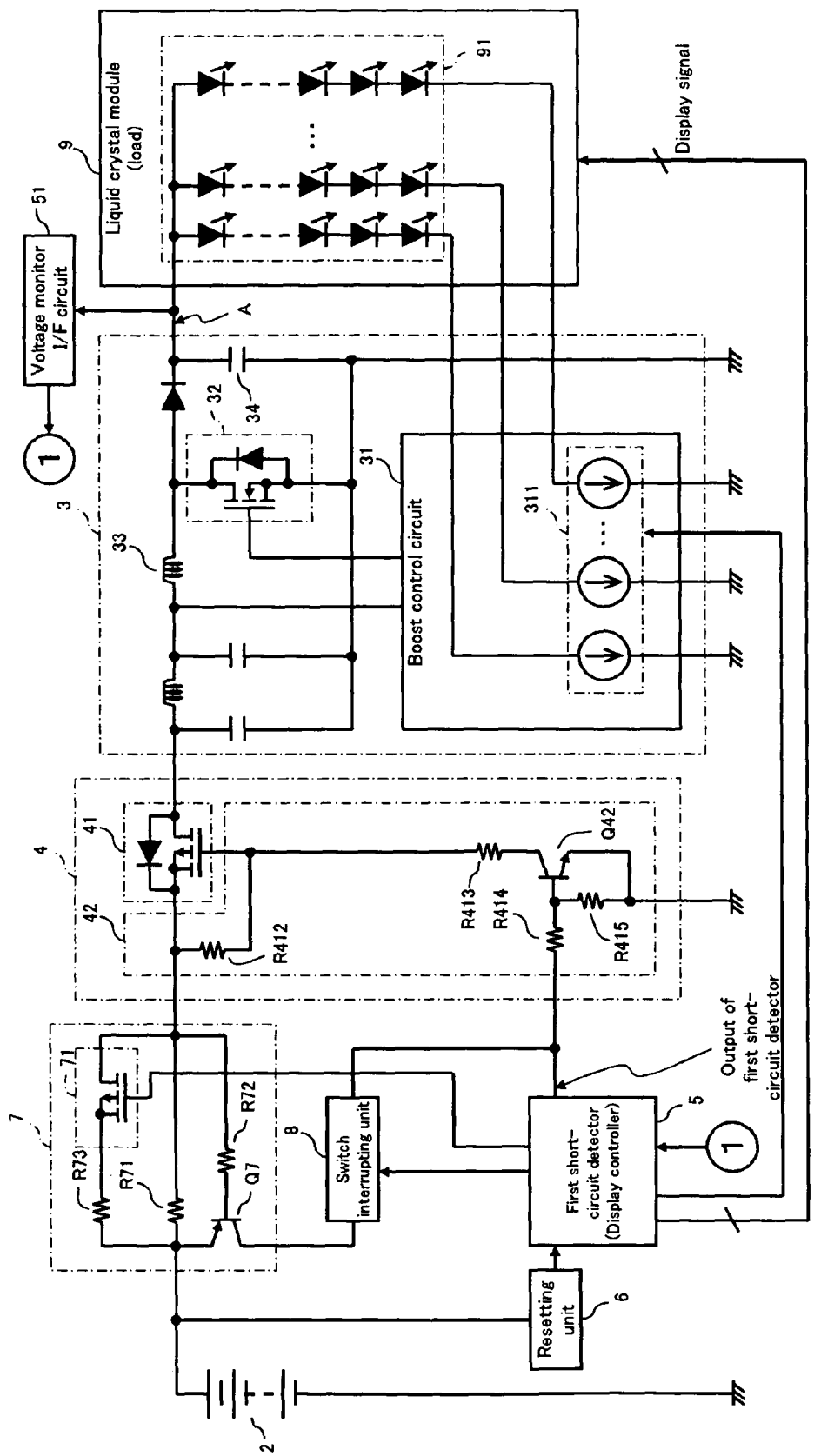
FIG. 9 shows a circuit diagram of a power protection apparatus and a DC regulator in the case where the second short-circuit detector is provided with a threshold switch unit.

Further, as shown in FIG. 9, the second short-circuit detector 7 may be formed so as to be able to switch the second short-circuit detection threshold voltage corresponding to current flowing in the MOS-FET 41 according to the state of the MOS-FET 71 by connecting two resistors R71 and R73 connected in parallel and the MOS-FET 71 as a switch for disconnecting the path to the resistor R73.

In this case, after the normal state is determined in the primary check, by decreasing the second short-circuit detection threshold voltage, as shown in FIG. 7D, the current smaller than the current value on startup of the DC regulator 3 and larger than the current value in the normal operation can be detected. A rare short circuit which occurs after the primary check can be detected by the second short-circuit detector 7.

The MOS-FET 71 is controlled by the first short-circuit detector 5. At the time of a primary check, the MOS-FET 41 is interrupted to increase the second short-circuit detection threshold voltage. The primary check is finished normally, and the MOS-FET 41 is made conductive. In the stationary state after designation time from start-up of the DC regulator 3, the MOS-FET 41 is made conductive and the second short-circuit detection threshold voltage is decreased.

The second short-circuit detector 7 is provided with a threshold switch unit for switching the threshold of the second short-circuit detection voltage. The first short-circuit detector 5 makes the MOS-FET 41 conductive when no short-circuit is detected, controls power supply to the load via the DC regulator 3, and decreases the threshold of the short-circuit detection voltage by the threshold switch unit.

As described above, the power protection apparatus of the present invention is assembled in the electronic control unit having the CPU for controlling the load connected to the DC regulator 3.

Another embodiment will be described below.

In the foregoing embodiment, the resetting unit 6 having the level detecting circuit for detecting whether or not the output voltage of the power source 2 decreases to a predetermined power supply voltage drop detection level or less has been described. Alternatively, the second short-circuit detector 7 may also serve as the resetting unit 6 including the case where the second short-circuit detector 7 has the threshold switch unit.

When an output signal of the switch interrupting unit 8 is input to the first short-circuit detector 5 and it is detected that the output signal of the switch interrupting unit 8 is at a short-circuit detection level at the time of rising of the first short-circuit detector 5 from the reset state, without performing the primary check, the apparatus waits. Alternatively, after resetting the state latching circuit 81, a normal primary check may be executed.

In the foregoing embodiment, the case where the power protection apparatus 1 detects a short circuit on the load side has been described. The concept of short-circuit in the present invention includes the case where over current flows due to an abnormality on the load side.

In the foregoing embodiment, the power protection apparatus directed to a booster-type switching regulator has been described. The power protection apparatus according to the present invention can be generally applied to the DC regulator 3 and can be applied to a step-down switching regulator, a booster/step-down switching regulator, and a series regulator.

Figure 10:
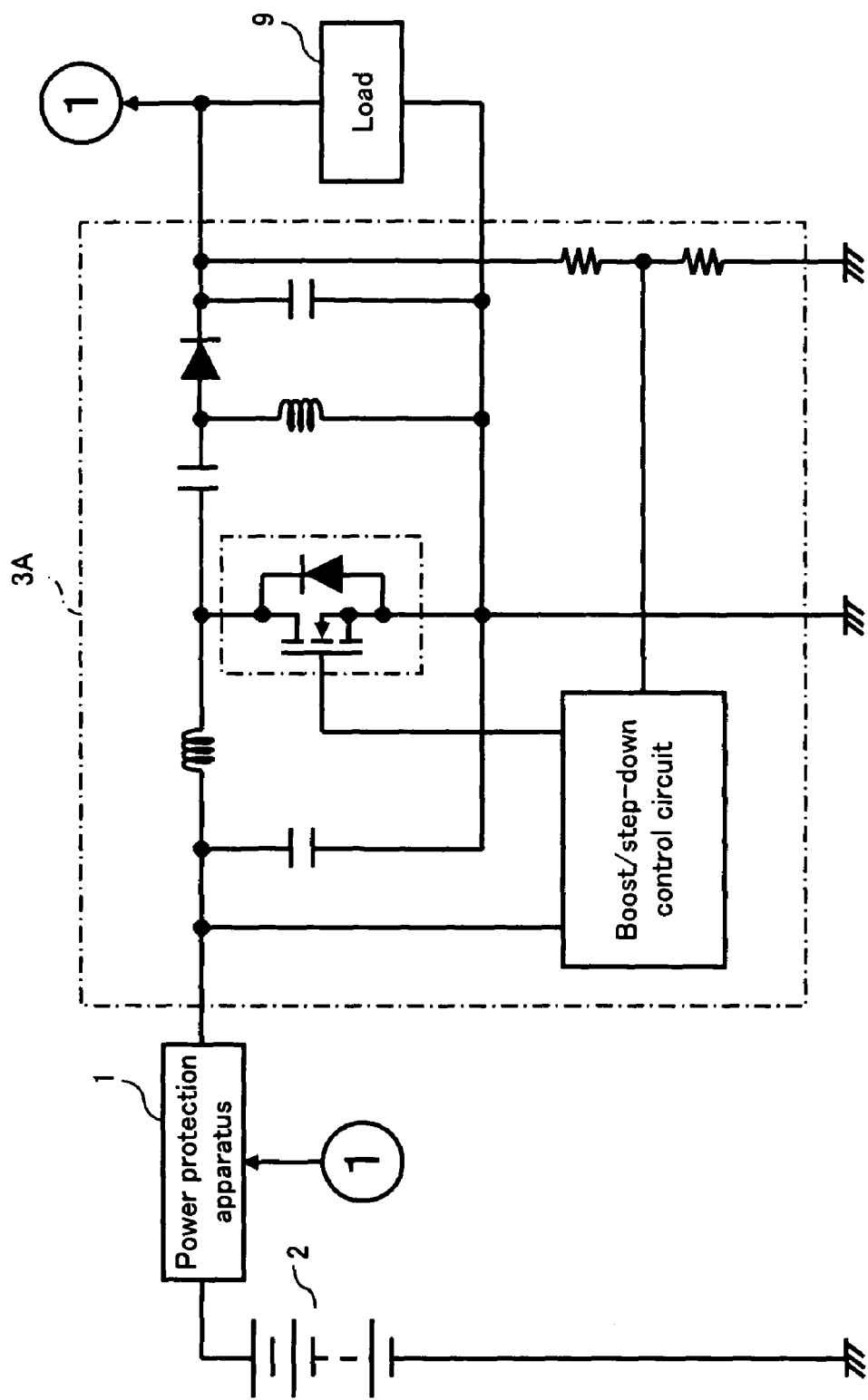
FIG. 10 is a circuit diagram showing the case where an SEPIC circuit is used as a DC regulator.
Figure 11:
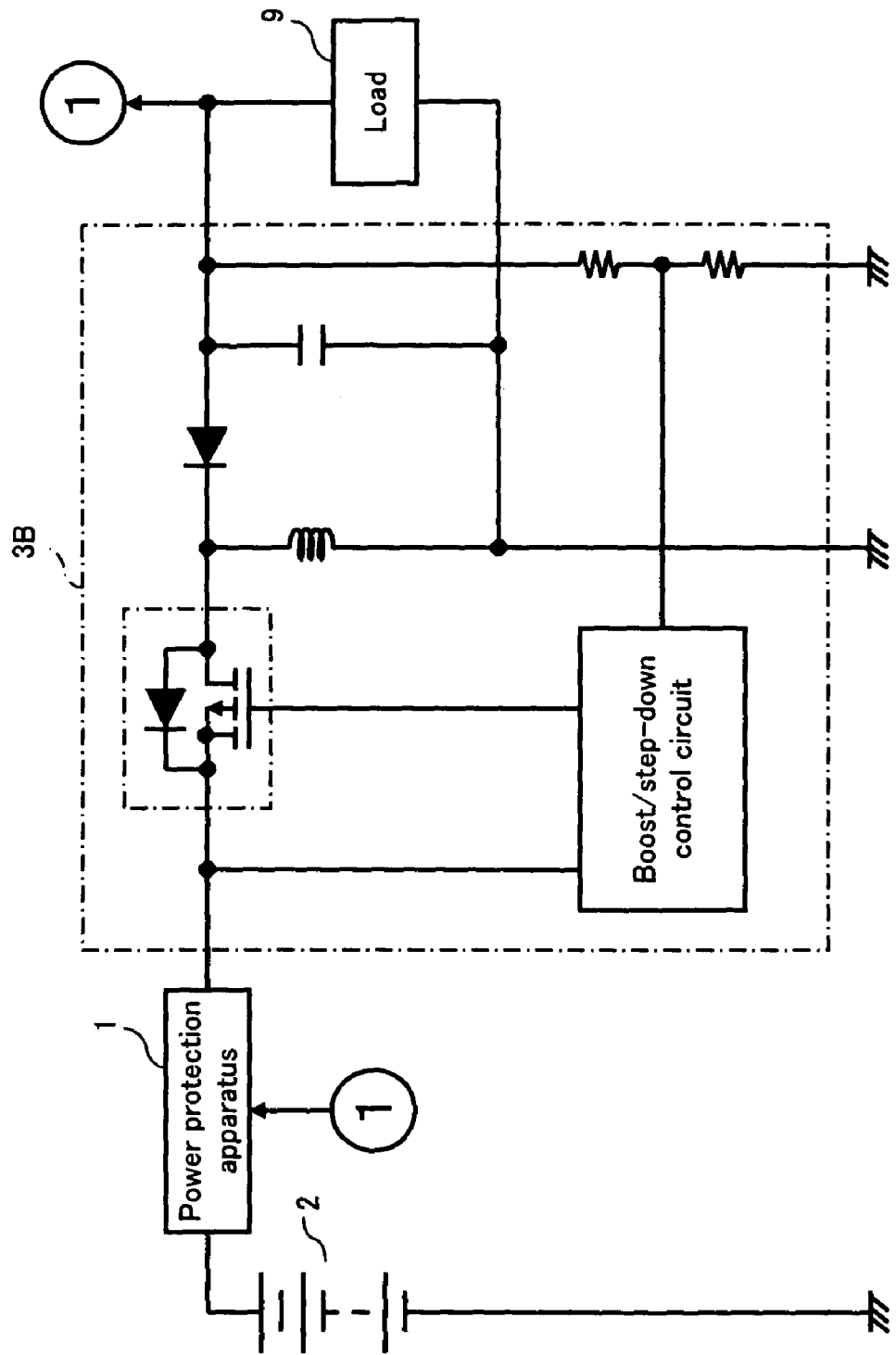
FIG. 11 is a circuit diagram showing the case where a back boost converter is used as a DC regulator.

For example, the DC regulator 3 may be an SEPIC (Single Ended Primary Inductance Converter) 3A which can boost and step down voltage as shown in FIG. 10 or a back boost converter 3B as shown in FIG. 11.

However, the present invention can be used more suitably to a DC regulator in which a switching element for adjusting voltage is connected in parallel with the power supply line.

In the foregoing embodiment, as the electronic control unit in which the power protection unit is assembled, an in-vehicle display controller for controlling a liquid crystal module has been described. The in-vehicle electronic control unit in which the power protection apparatus according to the present invention is assembled is not limited to a display controller. An arbitrary in-vehicle electronic control unit may be used such as an in-vehicle electronic control unit for an air bag having a CPU for controlling, as a load, an ignition circuit used for passing current to a filament and the like to make the air bag of a vehicle operate, and a memory for storing control information of the CPU.

Further, the power protection apparatus is not limited to be assembled in an in-vehicle electronic control unit but may be assembled in another vehicle such as a ship or an airplane, an electronic control unit of a business machine, or an arbitrary electronic control unit of an electrical household appliance.

Similarly, in the foregoing embodiment, the case where the power source 2 is an in-vehicle battery has been described. The power source is not limited to an in-vehicle battery but may be an arbitrary DC power source. For example, a DC power source rectified from a commercial power source may be also used.

The foregoing embodiment is just an example of the present invention. Obviously, concrete configurations and the like of the blocks can be properly changed within the range where the effects of the invention are produced.

What is claimed is:

1. A power protection apparatus comprising:
a switch unit connected in series in a power supply line from a power source to a DC regulator;
a first short-circuit detector for detecting a short circuit based on an output voltage value of the DC regulator obtained by making the switch unit conductive for predetermined time and, after that, interrupting the switch unit;
a resetting unit, when the output voltage of the power source drops to a predetermined voltage, for resetting operation of the first short-circuit detector;
a second short-circuit detector for detecting a short circuit based on a value of current flowed in the switch unit when the switch unit is conductive; and
a switch interrupting unit, when the short circuit is detected by the second short-circuit detector, for forcedly interrupting the switch unit regardless of a state of the switch unit controlled by the first short-circuit detector.

2. The power protection apparatus according to claim 1, wherein the second short-circuit detector is constructed by a hardware circuit.

3. The power protection apparatus according to claim 1, wherein the switch interrupting unit has a state latching circuit for maintaining an interruption state of the switch unit, and the state latching circuit is reset by the first short-circuit detector.

4. The power protection apparatus according to claim 1, wherein the first short-circuit detector repeats short-circuit detection a plurality of times and a storage is provided for storing abnormality information when a short circuit is detected in all of the plurality of times of short-circuit detection.

5. The power protection apparatus according to claim 1, wherein when no short circuit is detected, the first short-circuit detector makes the switch unit conductive to supply power to a load via the DC regulator.

6. The power protection apparatus according to claim 1, wherein the second short-circuit detector also serves as the resetting unit.

7. The power protection apparatus according to claim 1, further comprising a load controller for stopping power supply to a load connected to the DC regulator at the time of short-circuit detection by the first short-circuit detector.

8. The power protection apparatus according to claim 1, wherein the power supply is an in-vehicle battery and the DC regulator is a booster regulator.

9. A power protection apparatus comprising:
a switch unit connected in series in a power supply line from a power source to a DC regulator;
a first short-circuit detector for detecting a short circuit based on an output voltage value of the DC regulator obtained by making the switch unit conductive for predetermined time and, after that, interrupting the switch unit;
a resetting unit, when the output voltage of the power source drops to a predetermined voltage, for resetting operation of the first short-circuit detector;
a second short-circuit detector for detecting a short circuit based on a value of current flowed in the switch unit when the switch unit is conductive; and
a switch interrupting unit, when the short circuit is detected second short-circuit detector, for forcedly interrupting the switch unit regardless of a state of the switch unit controlled by the first short-circuit detector,
wherein the second short-circuit detector is constructed by a voltage detection circuit for detecting a voltage across a resistor connected in series with the switch unit, and a threshold of a short-circuit detection voltage of the second short-circuit detector is set to be larger than a threshold of a short-circuit detection voltage of the first short-circuit detector.

10. The power protection apparatus according to claim 9, wherein the second short-circuit detector is constructed by a hardware circuit.

11. The power protection apparatus according to claim 9, wherein the switch interrupting unit has a state latching circuit for maintaining an interruption state of the switch unit, and the state latching circuit is reset by the first short-circuit detector.

12. The power protection apparatus according to claim 9, wherein the first short-circuit detector repeats short-circuit detection a plurality of times and a storage is provided for storing abnormality information when a short circuit is detected in all of the plurality of times of short-circuit detection.

13. The power protection apparatus according to claim 9, wherein when no short circuit is detected, the first short-circuit detector makes the switch unit conductive to supply power to a load via the DC regulator.

14. The power protection apparatus according to claim 9, wherein the second short-circuit detector is provided with a threshold switch unit for switching a threshold of the short-circuit detection voltage, and
when the first short-circuit detector does not detect a short circuit, the switch unit is made conductive to supply power to a load via the DC regulator, and the short-circuit detection voltage threshold of the threshold switch unit is decreased.

15. The power protection apparatus according to claim 9, wherein the second short-circuit detector also serves as the resetting unit.

16. The power protection apparatus according to claim 9, further comprising a load controller for stopping power supply to a load connected to the DC regulator at the time of short-circuit detection by the first short-circuit detector.

17. The power protection apparatus according to claim 9, wherein the power supply is an in-vehicle battery and the DC regulator is a booster regulator.

18. An electronic control unit comprising:
a CPU for controlling a load connected to a DC regulator;
a memory for storing control information of the CPU; and
a power protection apparatus for controlling power supply from a power source to the DC regulator,
wherein the power protection apparatus comprises:
a switch unit connected in series in a power supply line from the power source to the DC regulator;
a first short-circuit detector for detecting a short circuit based on an output voltage value of the DC regulator obtained by making the switch unit conductive for predetermined time and, after that, interrupting the switch unit;
a resetting unit, when the output voltage of the power source drops to a predetermined voltage, for resetting operation of the first short-circuit detector;
a second short-circuit detector for detecting a short circuit based on a value of current flowed in the switch unit when the switch unit is conductive; and
a switch interrupting unit, when the short circuit is detected by the second short-circuit detector, for forcedly interrupting the switch unit regardless of a state of the switch unit controlled by the first short-circuit detector.

19. The electronic control unit according to claim 18, wherein the second short-circuit detector is constructed by a voltage detection circuit for detecting a voltage across a resistor connected in series with the switch unit, and a threshold of a short-circuit detection voltage of the second short-circuit detector is set to be larger than a threshold of a short-circuit detection voltage of the first short-circuit detector.

* * * * *